US012604634B2

(12) United States Patent
Cao et al.

(10) Patent No.: US 12,604,634 B2
(45) Date of Patent: Apr. 14, 2026

(54) DISPLAY PANEL AND DISPLAY DEVICE

(71) Applicant: HKC Corporation Limited, Shenzhen (CN)

(72) Inventors: Shangcao Cao, Shenzhen (CN); Rongrong Li, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 372 days.

(21) Appl. No.: 18/221,135

(22) Filed: Jul. 12, 2023

(65) Prior Publication Data

US 2024/0298498 A1      Sep. 5, 2024

(30) Foreign Application Priority Data

Mar. 2, 2023      (CN) .......................... 202310187311.2

(51) Int. Cl.
| | |
|---|---|
| *H10K 59/38* | (2023.01) |
| *H10K 59/131* | (2023.01) |
| *H10K 59/50* | (2023.01) |
| *H10K 59/80* | (2023.01) |

(52) U.S. Cl.
CPC ........... *H10K 59/38* (2023.02); *H10K 59/131* (2023.02); *H10K 59/50* (2023.02); *H10K 59/873* (2023.02); *H10K 59/8792* (2023.02)

(58) Field of Classification Search
CPC ...... H10K 59/38; H10K 59/131; H10K 59/50; H10K 59/873; H10K 59/8792
See application file for complete search history.

(56) References Cited

U.S. PATENT DOCUMENTS

| | | | |
|---|---|---|---|
| 2019/0324315 A1 | 10/2019 | Ohashi et al. | |
| 2023/0046219 A1* | 2/2023 | Lee .................... | H10K 59/8792 |
| 2025/0194419 A1* | 6/2025 | Jeong ................... | H10K 85/622 |

FOREIGN PATENT DOCUMENTS

| | | |
|---|---|---|
| CN | 1403856 A | 3/2003 |
| CN | 105301852 A | 2/2016 |
| CN | 105353533 A | 2/2016 |

(Continued)

OTHER PUBLICATIONS

Machine Translation of CN113745209.*

(Continued)

*Primary Examiner* — J.E. Schoenholtz
(74) *Attorney, Agent, or Firm* — Scully, Scott, Murphy & Presser, P.C.

(57) ABSTRACT

The present disclosure provides a display panel. The display panel includes a light emitting component and a light transmission control layer located on a light emitting side of the light emitting component. The light transmission control layer includes a first common electrode, a liquid crystal layer and a second common electrode that are stacked on the light emitting side of the light emitting component in sequence. The liquid crystal layer includes a plurality of liquid crystal molecules. The first common electrode and the second common electrode are used for selectively forming a preset electric field according to a light emitting state of the light emitting component. The preset electric field is used for driving the plurality of liquid crystal molecules to deflect, so as to control a transmittance of the light transmission control layer. The present disclosure also provides a display device having the display panel.

16 Claims, 5 Drawing Sheets

300

(56)                   References Cited

FOREIGN PATENT DOCUMENTS

| CN | 109873085 A | 6/2019 |
| CN | 110389466 A | 10/2019 |
| CN | 113745209 A * 12/2021 | ........... H10H 20/855 |
| CN | 114975565 A | 8/2022 |
| CN | 115101570 A | 9/2022 |
| CN | 115951525 A | 4/2023 |

OTHER PUBLICATIONS

International Search Report and Written Opinion dated Sep. 19, 2023 received in International Application No. PCT/CN2023/103548.
Chinese First Office Action dated Apr. 12, 2023 issued in CN Application No. 202310187311.2.

* cited by examiner

500

Housing

Display panel

DISPLAY PANEL AND DISPLAY DEVICE

CROSS-REFERENCE TO RELATED APPLICATION

This application claims priority to and benefits of Chinese Patent Application No. 202310187311.2, filed Mar. 2, 2023, the entire contents of which are incorporated herein by reference.

TECHNICAL FIELD

The present disclosure relates to fields of display technology, and in particular to a display panel and a display device having the display panel.

BACKGROUND

The quantum dot-Organic Light Emitting Diode (QD-OLED) display device is widely used in a display field due to its advantages of high colour gamut, high colour purity, long service life and a fact that it can be prepared by a printing process, and the like.

In the prior art, when external light is irradiated onto a QD-OLED display device, it usually excites the quantum dots within the QD-OLED display device, which causes the QD-OLED display device to show significant glare. Currently, external light can be blocked by adding a corresponding colour barrier to the quantum dots in order to avoid glare. However, the glare still occurs when looking at the QD-OLED display device obliquely, and the colour barrier reduces the transmittance of the QD-OLED display device and increases the power consumption.

Therefore, for those skilled in the art, how to solve the problem of glare on the QD-OLED display devices without affecting the transmittance of the QD-OLED display devices is an urgent problem to be solved.

SUMMARY

In view of the aforementioned shortcomings of the prior art, the present disclosure aims to provide a display panel and a display device having the display panel, which is intended to solve a problem of glare in the QD-OLED display device without affecting a transmittance of the QD-OLED display device.

In order to solve the above technical problems, embodiments of the present disclosure provide a display panel. The display panel includes a light emitting component and a light transmission control layer located on a light emitting side of the light emitting component. The light transmission control layer includes a first common electrode, a liquid crystal layer and a second common electrode. The first common electrode, the liquid crystal layer and the second common electrode are stacked on the light emitting side of the light emitting component in sequence. The liquid crystal layer includes a plurality of liquid crystal molecules. The first common electrode and the second common electrode are used for selectively forming a preset electric field according to a light emitting state of the light emitting component. The preset electric field is used for driving the plurality of liquid crystal molecules to deflect, so as to control a transmittance of the light transmission control layer.

In summary, the display panel provided by embodiments of the present disclosure includes a light emitting component and a light transmission control layer. The light transmission control layer includes a first common electrode, a liquid crystal layer and a second common electrode. The first common electrode, the liquid crystal layer and the second common electrode are stacked on the light emitting side of the light emitting component in sequence. The liquid crystal layer includes a plurality of liquid crystal molecules. The first common electrode and the second common electrode are used for selectively forming a preset electric field according to the light emitting state of the light emitting component. The preset electric field is used for driving the plurality of liquid crystal molecules to deflect, so as to control the transmittance of the light transmission control layer. Therefore, when the light emitting component emits light, the light transmission control layer transmits light, so that the display panel has a higher transmittance; when the light emitting component does not emit light, the light transmission control layer does not transmit light, so as to avoid a glare of the light emitting component caused by external light. Since external light cannot enter the light emitting component through the light transmission control layer, even when the display panel is viewed obliquely, there is still no glare.

Based on a same inventive concept, embodiments of the present disclosure further provides a display device. The display device includes a housing and a display panel as described above. The display panel is located within the housing and the light emitting side of the display panel is exposed from the housing.

In summary, the display device provided in the embodiments of the present disclosure includes a housing and a display panel. The display panel includes a light emitting component and a light transmission control layer. The light transmission control layer includes a first common electrode, a liquid crystal layer and a second common electrode. The first common electrode, the liquid crystal layer and the second common electrode are stacked on the light emitting side of the light emitting component in sequence. The liquid crystal layer includes a plurality of liquid crystal molecules. The first common electrode and the second common electrode are used for selectively forming a preset electric field according to a light emitting state of the light emitting component. The preset electric field is used for driving the plurality of liquid crystal molecules to deflect, so as to control the transmittance of the light transmission control layer. Therefore, when the light emitting component emits light, the light transmission control layer transmits light, so that the display panel has a higher transmittance; when the light emitting component does not emit light, the light transmission control layer does not transmit light, so as to avoid a glare of the light emitting component caused by external light. Since external light cannot enter the light emitting component through the light transmission control layer, even when the display panel is viewed obliquely, there is still no glare.

BRIEF DESCRIPTION OF THE ACCOMPANYING DRAWINGS

In order to more clearly illustrate the technical solutions in the embodiments of the present disclosure, a brief description of the accompanying drawings to be used in the embodiments will be given below. Obviously, for a person skill in the art, the accompanying drawings in the following description are some of the embodiments of the present disclosure, and that other accompanying drawings may be obtained from these without creative effort.

THE DESCRIPTION OF REFERENCE SIGNS

Figure 1:
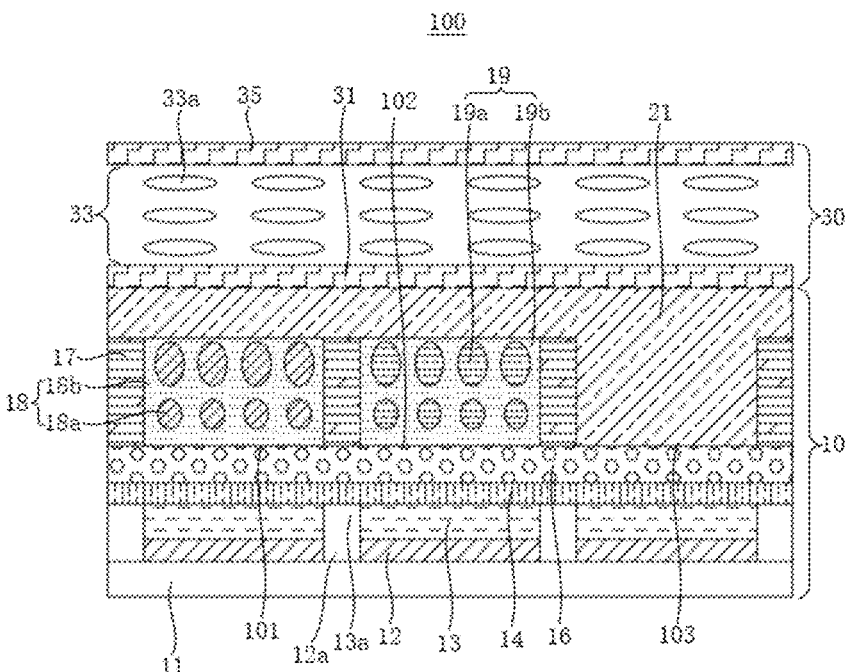
FIG. 1 is a structural schematic diagram of a display panel in an opaque state in accordance with a first embodiment of the present disclosure.

10—light emitting component; 11—driver circuit layer; 12—anode layer; 12*a*—first gap; 13—light emitting element; 13*a*—second gap; 14—cathode layer 16—first encapsulating layer; 16*a*—second via; 17—light-shielding pattern layer; 18—first color conversion member; 18*a*—first quantum dot; 18*b*—first package structure; 18*b*—second first package structure; 19—second color conversion member; 19*a*—second quantum dot; 19*b*—second package structure; 21—second encapsulating layer; 21*a*—first via; 23—connecting member; 25—conductive pattern layer; 30—light transmission control layer; 31—first common electrode; 33—liquid crystal layer; 33*a*—liquid crystal molecules; 35—second common electrode; 100—display panel; 101—first accommodation space; 102—second accommodation space; 103—third accommodation space; 200—display panel; 300—display panel; 500—display device.

DETAILED DESCRIPTION OF ILLUSTRATED EMBODIMENTS

In order to facilitate an understanding of the present disclosure, it will be described more fully below with reference to the relevant accompanying drawings. A preferred embodiment of the present disclosure is given in the accompanying drawings. However, the present disclosure can be implemented in many different forms and is not limited to the embodiments described herein. In contrast, these embodiments are provided for the purpose of providing a more thorough and comprehensive understanding of the disclosure of this application.

The following embodiments are described with reference to attached drawings to exemplify particular embodiments in which the present disclosure may be implemented. The serial numbers themselves, such as "first", "second", etc., given to the components herein are used only to distinguish the objects described and do not have any sequential or technical meaning. The directional terms mentioned in this application, for example, "up", "down", "front", "back" "left", "right", "inside", "outside", "side", etc., are merely references to the orientation of the attached drawings. Therefore, the orientation terms used are for the purpose of better and clearer description and understanding of the present disclosure, and do not indicate or imply that the device or element referred to must have a specific orientation, be constructed and operated in a specific orientation, and therefore cannot be construed as a limitation of the present disclosure.

In the description of the present disclosure, it is to be noted that, unless otherwise expressly specified and limited, the terms "mounted", "connected to", "connected" are to be understood in a broad sense and may, for example, they may be a fixed connection, may be a removable connection, may be a one-piece connection, may be a mechanical connection, may be a direct connection, may be an indirect connection through an intermediate medium, or may be a connection within two components. For a person of ordinary skill in the art, the specific meaning of the above terms in the context of the present disclosure can be understood in specific cases. It should be noted that the terms "first", "second" and the like in the specification and claims of the present disclosure and in the accompanying drawings are used to distinguish different objects and are not intended to describe a particular order. In addition, the terms "includes," "may include," "comprises" or "may comprise" as used in the present disclosure denotes the existence of the corresponding function, operation, component, etc. and does not limit one or more other further functions, operations, components, etc. In addition, the terms "include" or "comprise" denote the presence of the corresponding features, numbers, steps, operations, elements, components, or combinations thereof disclosed in the specification, without excluding the presence or addition of one or more other features, numbers, steps, operations, elements, components, or combinations thereof, with the intent to cover non-exclusive inclusion. It should be understood that "at least one" as described herein means one and more, such as one, two or three, etc., and "plurality of" means at least two, such as two or three, etc., unless otherwise expressly and specifically limited.

Unless otherwise defined, all technical and scientific terms used herein have the same meaning as commonly understood by those skilled in the art to which the present disclosure belongs. The terms used herein in the specification of the present disclosure are used for the purpose of describing specific embodiments only and are not intended to limit the present disclosure.

Referring to FIG. 1, FIG. 1 is a structural schematic diagram of a display panel in an opaque state in accordance with a first embodiment of the present disclosure. As shown in FIG. 1, the display panel 100 provided in embodiments of the present disclosure may include a light emitting component 10. The light emitting component 10 is used to emit light so as to display colour. The display panel 100 further includes a light transmission control layer 30. The light transmission control layer 30 includes a first common electrode 31, a liquid crystal layer 33 and a second common electrode 35. The first common electrode 31, the liquid crystal layer 33 and the second common electrode 35 are stacked on a light emitting side of the light emitting component 10 in sequence. That is, the first common electrode 31 is located on a light emitting side of the light emitting component 10; the liquid crystal layer 33 is located on one side of the first common electrode 31 away from the light emitting component 10, and the second common electrode 35 is located on one side of the liquid crystal layer 33 away from the first common electrode 31, i.e. the liquid crystal layer 33 is located between the first common electrode 31 and the second common electrode 35. The liquid crystal layer 33 includes a plurality of liquid crystal molecules 33*a*. The first common electrode 31 and the second common electrode 35 are used for selectively forming a preset electric field according to a light emitting state of the light emitting component 10. The preset electric field is used for driving the plurality of liquid crystal molecules 33*a* to deflect, so as to control a transmittance of the light transmission control layer 30.

Figure 2:
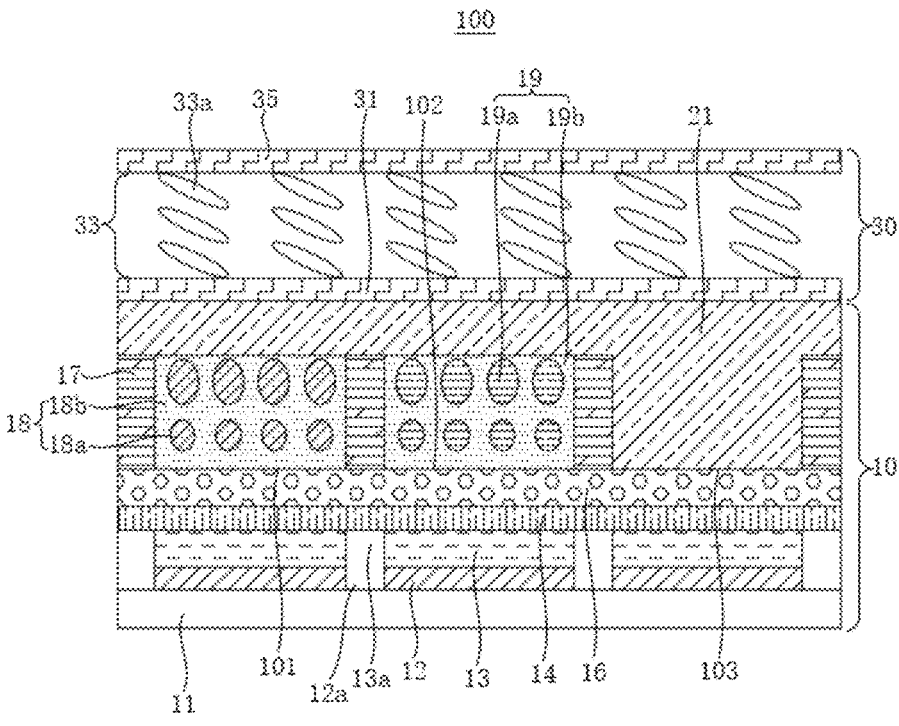
FIG. 2 is a structural schematic diagram of a display panel in a light-transmitting state in accordance with a first embodiment of the present disclosure.

Referring to FIG. 2, FIG. 2 is a structural schematic diagram of a display panel in a light-transmitting state in accordance with a first embodiment of the present disclosure. It can be understood that when the light emitting component 10 emits light, the preset electric field controls the plurality of liquid crystal molecules 33*a* to deflect, which causes the transmittance of the light transmission control layer 30 to increase. The light transmission control layer 30 does not affect the transmittance of the display panel 100 when the light emitting component 10 emits light. Referring to FIG. 1, when the light emitting component 10 does not emit light, the preset electric field disappears and the plurality of liquid crystal molecules 33*a* reset, so that the transmittance of the light transmission control layer 30 decreases; the external light cannot pass through the light transmission control layer 30 into the light emitting component 10, preventing glare from occurring in the light emitting component 10. In other words, when the light emitting component 10 emits light, the light transmission control layer 30 transmits light; when the light emitting component 10 does not emit light, the light transmission control layer 30 does not transmit light, so that external light cannot pass through the light transmission control layer 30 into the light emitting component 10, thus preventing glare from occurring in the light emitting component 10. Even when the display panel 100 is viewed obliquely, there is still no glare.

It can also be understood that the liquid crystal molecules 33*a* may be elliptical in shape. When the preset electric field is not formed, a direction of a long axis of the liquid crystal molecules 33*a* may be perpendicular to a direction of incidence direction of the external light so as to block the external light; when the preset electric field is formed, a direction of a long axis of the liquid crystal molecules 33*a* may be oriented parallel or approximately parallel to a light emitting direction of the light emitting component 10, so that the light emitted by the light emitting component 10 can transmit the light transmission control layer 30. Alternatively, when the preset electric field is not formed, the plurality of liquid crystal molecules 33*a* are scattered distribution and external light is scattered by the plurality of liquid crystal molecules 33*a* which are scattered distribution, so that external light cannot pass through the light transmission control layer 30. When the preset electric field is formed, the preset electric field drives the plurality of liquid crystal molecules 33*a* to be in a regular arrangement, and the light emitted by the light emitting component 10 can pass through the light transmission control layer 30. The light emitting component 10 may emit light in a direction opposite to the incidence direction of the external light.

In an embodiment of the present disclosure, an electric potential of the first common electrode 31 is different from an electric potential of the second common electrode 35, in order to form the preset electric field.

In an exemplary embodiment, the display panel 100 may be a Quantum Dot-Organic Light Emitting Diode (QD-OLED) display panel.

In an exemplary embodiment, the materials of the first common electrode 31 and the second common electrode 35 may both be indium tin oxide (ITO). The first common electrode 31 and the second common electrode 35 can also be other materials with better electrical conductivity and better transparency, which are not specifically limited by the present disclosure. It can be understood that indium tin oxide has a better transparency to avoid the first common electrode 31 and the second common electrode 35 from affecting the transmittance of the display panel 100.

In summary, the display panel 100 provided in embodiments of the present disclosure includes a light emitting component 10 and a light transmission control layer 30. The light transmission control layer 30 includes a first common electrode 31, a liquid crystal layer 33 and a second common electrode 35. The first common electrode 31, the liquid crystal layer 33 and the second common electrode 35 are stacked on a light emitting side of the light emitting component 10 in sequence. That is, the first common electrode 31 is located on a light emitting side of the light emitting component 10, the liquid crystal layer 33 is located on one side of the first common electrode 31 away from the light emitting component 10, and the second common electrode 35 is located on one side of the liquid crystal layer 33 away from the first common electrode 31. The liquid crystal layer 33 includes a plurality of liquid crystal molecules 33*a*. The first common electrode 31 and the second common electrode 35 are used for forming a preset electric field. The preset electric field is used for driving the plurality of liquid crystal molecules 33*a* to deflect, so as to control a transmittance of the light transmission control layer 30. When the light emitting component 10 does not emit light, the light transmission control layer 30 does not transmit light, so as to avoid the glare of the light emitting component 10 caused by external light. Since external light cannot pass through the light transmission control layer 30 into the light emitting component 10, even when the display panel 100 is viewed obliquely, there is still no glare.

Referring to FIGS. 1 and 2, in embodiments of the present disclosure, the light emitting component 10 includes a driver circuit layer 11, a plurality of anode layers 12, a plurality of light emitting elements 13, and a cathode layer 14. The driver circuit layer 11 may be a bottom layer of the light emitting component 10, which is used to set the structures of the other layers of the light emitting component 10. The driver circuit layer 11 is located opposite to the light transmission control layer 30. The plurality of anode layers 12 are spaced apart from each other and located on one side of the driver circuit layer 11 facing the light transmission control layer 30 and electrically connected to the driver circuit layer 11. The plurality of light emitting elements 13 are spaced apart from each other, and are located on one side of the anode layer 12 away from the driver circuit layer 11, and electrically connected to the anode layer 12. The cathode layer 14 is located on one side of the light emitting element 13 away from the anode layer 12 and is electrically connected to the plurality of light emitting elements 13. The driver circuit layer 11 is used to drive the plurality of light emitting elements 13 to emit base light.

In an exemplary embodiment, the plurality of anode layers 12 are spaced from each other by first gaps 12*a*; the plurality of light emitting elements 13 are spaced from each other by second gaps 13*a*. A position of the first gap 12*a* corresponds to a position of the second gap 13*a*. The first gap 12*a* is interconnected to the second gap 13*a* to form a through-hole. The through-holes space the plurality of anode layers 12 apart and space the plurality of light emitting elements 13 apart. The cathode layer 14 is located on one side of the light emitting elements 13 away from the anode layers 12, and covers the second gaps 13*a*. A size of the first gap 12*a* may be larger, smaller or equal to a size of the second gap 13*a*, which is not specifically limited by the present disclosure.

In an exemplary embodiment, the plurality of anode layers 12 are distributed in an array on the driver circuit layer 11; the plurality of light emitting elements 13 are also distributed in an array. The positions of the plurality of anode layers 12 correspond to the positions of the plurality of light emitting elements 13. That is, an orthographic projection of one anode layer 12 on the driver circuit layer 11 coincides or partially coincides with an orthographic projection of one light emitting element 13 on the driver circuit layer 11. It is also possible that the orthographic projection area of the anode layer 12 on the driver circuit layer 11 is greater or less than the orthographic projection of the light emitting element 13 on the driver circuit layer 11, which is not specifically limited by the present disclosure.

In an exemplary embodiment, the driver circuit layer 11 may drive the plurality of light emitting elements 13 to emit light by a passive matrix (PM) or an active matrix (AM). The passive matrix means that the pulsed current is applied directly to the light emitting element 13. The active matrix means that the driver circuit layer 11 is equipped with a thin film transistor with switching supply and a charge storage capacitor for each light emitting element 13.

In an exemplary embodiment, the cathode layer 14 is electrically connected to the plurality of light emitting elements 13, saving space in the layout of the light emitting component 10 and also facilitating processing and fabrication.

In an exemplary embodiment, the materials of the anode layer 12 may be aluminium (Al) or silver (Ag); the materials of the cathode layer 14 may be aluminium or silver. The light emitting element 13 may be an organic light emitting material. The base light emitted by the light emitting element 13 may be blue light. It can be understood that aluminium or silver has a better functional match with organic light emitting materials, which is conducive to improving the injection efficiency of electrons to improve the light emitting efficiency of the organic light emitting materials.

In embodiments of the present disclosure, the light emitting component 10 further includes a first encapsulating layer 16. The first encapsulating layer 16 is located on one side of the cathode layer 14 away from the light emitting elements 13. The first encapsulating layer 16 is used to insulate from impurities such as water vapor, oxygen, dust and the like to protect the light emitting elements 13.

Referring to FIGS. 1 and 2, in embodiments of the present disclosure, the light emitting component 10 further includes a light-shielding pattern layer 17. The light-shielding pattern layer 17 is located on one side of the first encapsulating layer 16 away from the cathode layer 14. The light-shielding pattern layer 17 defines a plurality of first accommodation spaces 101, a plurality of second accommodation spaces 102 and a plurality of third accommodation spaces 103.

In an exemplary embodiment, a portion of the light-shielding pattern layer 17 removing the plurality of first accommodation spaces 101, the plurality of second accommodation spaces 102, and the plurality of third accommodation spaces 103 corresponds to areas in which the plurality of light emitting elements 13 are spaced apart. That is, the portion of the light-shielding pattern layer 17 removing the plurality of first accommodation spaces 101, the plurality of second accommodation spaces 102 and the plurality of third accommodation spaces 103 correspond to the first gaps 12a and to the second gaps 13a. Thus, the orthographic projection of the light-shielding pattern layer 17 on the driver circuit layer 11 does not coincide with to the orthographic projection of the plurality of light emitting elements 13 on the driver circuit layer 11, avoiding the light-shielding pattern layer 17 from blocking the light emitted by the light emitting elements 13. It can be understood that the portion of the light-shielding pattern layer 17 removing the plurality of first accommodation space 101, the plurality of second accommodation space 102, and the plurality of third accommodation space 103, refer to a portion of the light-shielding pattern layer 17 for spacing the first accommodation spaces 101, the second accommodation spaces 102, and the third accommodation spaces 103.

In an exemplary embodiment, a position of one first accommodation space 101 corresponds to a position of one light emitting element 13; a position of one second accommodation space 102 corresponds to a position of one light emitting element 13, a position of one third accommodation space 103 corresponds to a position of one light emitting element 13.

In an exemplary embodiment, the plurality of first accommodation spaces 101, the plurality of second accommodation spaces 102 and the plurality of third accommodation spaces 103 may be set apart alternately in sequence. That is, the plurality of first accommodation spaces 101, the plurality of second accommodation spaces 102 and the plurality of third accommodation spaces 103 may be set in a following order: one first accommodation space 101, one second accommodation space 102, one third accommodation space 103, one first accommodation space 101, one second accommodation space 102, one third accommodation space 103, one first accommodation space 101, one second accommodation space 102, one third accommodation space 103. It can be understood that the plurality of first accommodation spaces 101, the plurality of second accommodation spaces 102 and the plurality of third accommodation spaces 103 may also be set in other arrangements, which are not particularly limited by the present disclosure.

In an exemplary embodiment, portions of the first encapsulating layer 16 are exposed from the first accommodation spaces 101, the second accommodation spaces 102 and the third accommodation spaces 103.

Referring to FIGS. 1 and 2, in embodiments of the present disclosure, the light emitting component 10 further includes a plurality of first color conversion members 18 and a plurality of second color conversion members 19. The first color conversion member 18 is located in the first accommodation space 101 and is connected to the first encapsulating layer 16. The second color conversion member 19 is located in the second accommodation space 102 and is connected to the first encapsulating layer 16. The first color conversion member 18 is used to convert the base light into a first colour light; and the second color conversion member 19 is used to convert the base light into a second colour light for full color display. The first color light may be red light and the second colour light may be green light.

It can be understood that the position corresponding to the first accommodation space 101 emits red light, the position corresponding to the second accommodation space 102 emits green light and the position corresponding to the third accommodation space 103 emits blue light, so as to achieve a full colour display. The light-shielding pattern layer 17 may be used to avoid colour crosstalk in positions corresponding to adjacent accommodation spaces. That is, there is colour crosstalk between the first accommodation space 101 and the second accommodation space 102 and there is colour crosstalk between the second accommodation space 102 and the third accommodation space 103.

In an exemplary embodiment, a position of one first color conversion member 18 corresponds to a position of one light emitting element 13, i.e. an orthographic projection of one first color conversion member 18 on the driver circuit layer 11 coincides or partially coincides with an orthographic projection of one light emitting element 13 on the driver circuit layer 11. It is also possible that the orthographic projection area of the first color conversion member 18 on the driver circuit layer 11 is greater than or less than the orthographic projection area of the light emitting element 13 on the driver circuit layer 11, which is not specifically limited by the present disclosure. A position of one second color conversion member 19 corresponds to a position of one light emitting element 13, i.e. the orthographic projection of one second color conversion member 19 on the driver circuit layer 11 coincides or partially coincides with the orthographic projection of one light emitting element 13 on the driver circuit layer 11. It is also possible that the orthographic projection area of the second color conversion member 19 on the driver circuit layer 11 is greater or less than the orthographic projection area of the light emitting element 13 on the driver circuit layer 11, which is not specifically limited by the present disclosure.

In an exemplary embodiment, the first color conversion member 18 and the second color conversion member 19 may be formed by a vapor deposition process or a printing process.

In embodiments of the present disclosure, each the first color conversion member 18 includes a plurality of first quantum dots 18a and a first package structure 18b. The plurality of first quantum dots 18a are distributed in multiple layers in the first accommodation space 101. The first quantum dots 18a are used to convert the base light into the first colour light. The first package structure 18b is filled within the first accommodation space 101 and connected to the first encapsulating layer 16 so as to hold the plurality of first quantum dots 18a, i.e. the first package structure 18b is filled within the first accommodation space 101 and holds the plurality of first quantum dots 18a within the first accommodation space 101. Each the second color conversion member 19 includes a plurality of second quantum dots 19a and a second package structure 19b. The plurality of second quantum dots 19a are distributed in multiple layers in the second accommodation space 102. The second quantum dots 19a are used to convert the base light into the second colour light. The second package structure 19b is filled within the second accommodation space 102 and connected to the first encapsulating layer 16, so as to hold the plurality of second quantum dots 19a, i.e. the second package structure 19b is filled within the second accommodation space 102 and holds the plurality of second quantum dots 19a within the second accommodation space 102.

In embodiments of the present disclosure, in a light emitting direction of the display panel 100 (i.e. in a direction of the light transmission control layer 30 away from the light emitting component 10), the sizes of the first quantum dots 18a are gradually increased, and the sizes of the second quantum dots 19a are gradually increased. For example, the plurality of first quantum dots 18a in FIG. 1 and FIG. 2 are distributed in two layers, the sizes of the first quantum dots 18a in a layer close to the first encapsulating layer 16 are smaller than the sizes of the first quantum dots 18a in a layer away from the first encapsulating layer 16. The plurality of second quantum dots 19a in FIGS. 1 and 2 are distributed in two layers, the sizes of the second quantum dots 19a in a layer close to the first encapsulating layer 16 are smaller than the sizes of the second quantum dots 19a in a layer away from the first encapsulating layer 16. The plurality of first quantum dots 18a may not only be distributed in two layers, and the plurality of second quantum dots 19a may not only be distributed in two layers, but in more than two layers, which also fall within the protection scope of the present disclosure.

It can be understood that the larger the size of the quantum dot, the higher the energy required to excite its light, so that the size of the quantum dot gradually increases in a direction of the light emitted from the display panel 100, the external light is first to irradiate on the larger quantum dot. Since the larger quantum dots are less likely to be excited, the glare of the display panel 100 can be further prevented.

In an exemplary embodiment, the first quantum dot 18a may be a red quantum dot and the second quantum dot 19a may be a green quantum dot.

In an exemplary embodiment, the blue light has a wavelength range of 300 nm to 400 nm, and the red light and the green light both have a wavelength range of 400 nm to 600 nm. The blue light irradiating a red quantum dot excites red light and the blue light irradiating a green quantum dot excites green light.

In an exemplary embodiment, a surface of the first package structure 18b away from the first encapsulating layer 16 is flush with a surface of the light-shielding pattern layer 17 away from the first encapsulating layer 16. A surface of the second package structure 19b away from the first encapsulating layer 16 is flush with a surface of the light-shielding pattern layer 17 away from the first encapsulating layer 16.

Referring to FIGS. 1 and 2, in embodiments of the present disclosure, the light emitting component 10 further includes a second encapsulating layer 21. The second encapsulating layer 21 covers on the light-shielding pattern layer 17 and the plurality of first color conversion members 18 and the plurality of second color conversion members 19, and extends into the third accommodation space 103 and connected to the first encapsulating layer 16. The second encapsulating layer 21 is used to insulate from impurities such as water vapor, oxygen, dust and the like to protect the plurality of first colour conversion members 18 and the plurality of second colour conversion members 19.

In an exemplary embodiment, the first common electrode 31 is located on one side of the second encapsulating layer 21 away from the first encapsulating layer 16.

Figure 3:
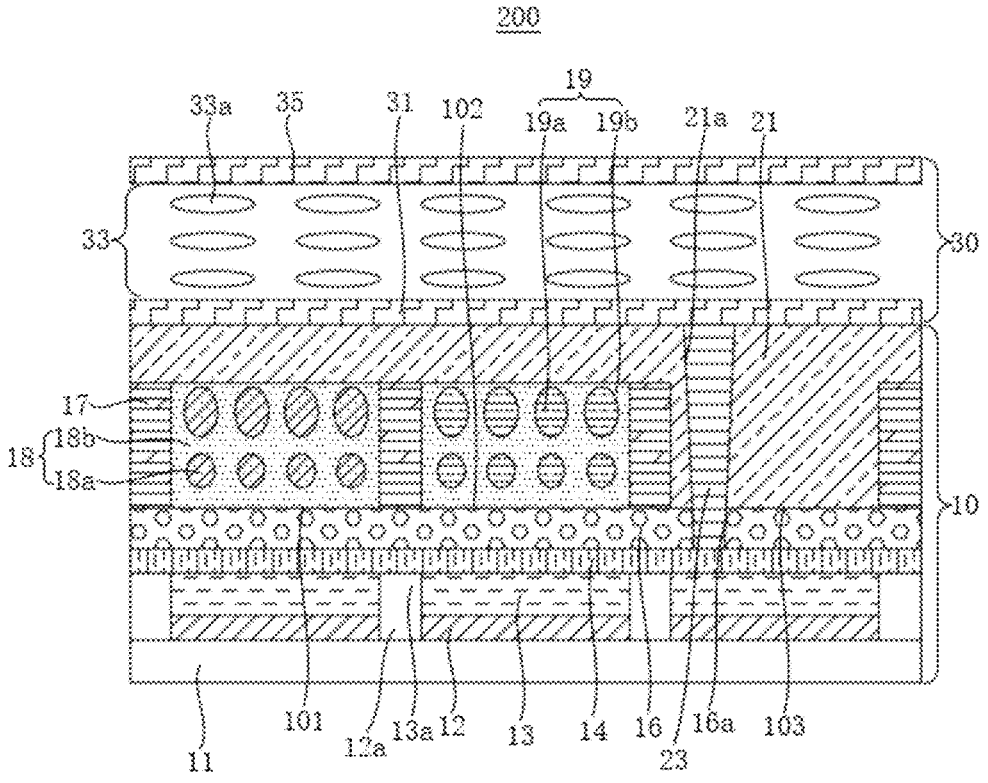
FIG. 3 is a schematic diagram of a layer structure of the display panel in accordance with a second embodiment of the present disclosure.

Referring to FIG. 3, FIG. 3 is a schematic diagram of a layer structure of the display panel in accordance with a second embodiment of the present disclosure. The display panel 200 disclosed in the second embodiment differs from the display panel 100 disclosed in the first embodiment in that the first common electrode 31 is electrically connected to the cathode layer 14.

In embodiments of the present disclosure, the second encapsulating layer 21 defines a plurality of first vias 21a on one side of the second encapsulating layer 21 away from the first encapsulating layer 16. The first encapsulating layer 16 defines a plurality of second vias 16a on one side of the first encapsulating layer 16 away from the cathode layer 14. The first via 21a is interconnected with the second via 16a. A position of the first via 21a, a position of the second via 16a and a position of the third accommodation space 103 are corresponding to each other. The first via 21a cuts through the second encapsulating layer 21. The second via 16a cuts through the first encapsulating layer 16. Part of the cathode layer 14 is exposed from the second via 16a.

In an exemplary embodiment, the positions of the plurality of first vias 21a, the positions of the plurality of second vias 16a correspond to the positions of the plurality of third accommodation spaces 103 one by one. The plurality of first vias 21a are interconnected with the plurality of second vias 16a one by one.

In embodiments of the present disclosure, the light emitting component 10 further includes a plurality of connecting members 23. The connecting members 23 are located between the first common electrode 31 and the cathode layer 14. The connecting member 23 is located within the first via 21a and within the second via 16a, and opposite ends of the connecting member 23 are connected to the cathode layer 14 and to the first common electrode 31, respectively, so as to electrically connect the first common electrode 31 to the cathode layer 14.

It can be understood that the first common electrode 31 is electrically connected to the cathode layer 14, when the light emitting component 10 emits light, the first common electrode 31 and the second common electrode 35 form the preset electric field, the light transmission control layer 30 transmits light, i.e. the light transmission control layer 30 is in a light-transmitting state; when the light emitting component 10 does not emit light, the preset electric field disappears and the light transmission control layer 30 does not transmit light, i.e. the light transmission control layer 30 is in an opaque state. Thus, when the first common electrode 31 is electrically connected to the cathode layer 14, the switching time between the light transmission control layer 30 in the light-transmitting state and in the opaque state is made to be the same as that of the light emitting component 10 between light emitting and non-light emitting. Furthermore, additional circuitry electrically connected to the first common electrode 31 can be omitted, the circuitry of the display panel 100 is simplified, facilitating processing and production. At the same time, the impedance of the cathode layer 14 is reduced, voltage drops (IR Drop) in the cathode layer 14 can be avoided.

In an exemplary embodiment, the materials of the connecting member 23 may be Indium Tin Oxide (ITO). It can be understood that indium tin oxide has a better transparency to avoid the connecting member 23 from affecting the transmittance in the area where the third accommodation space 103 is located.

Figure 4:
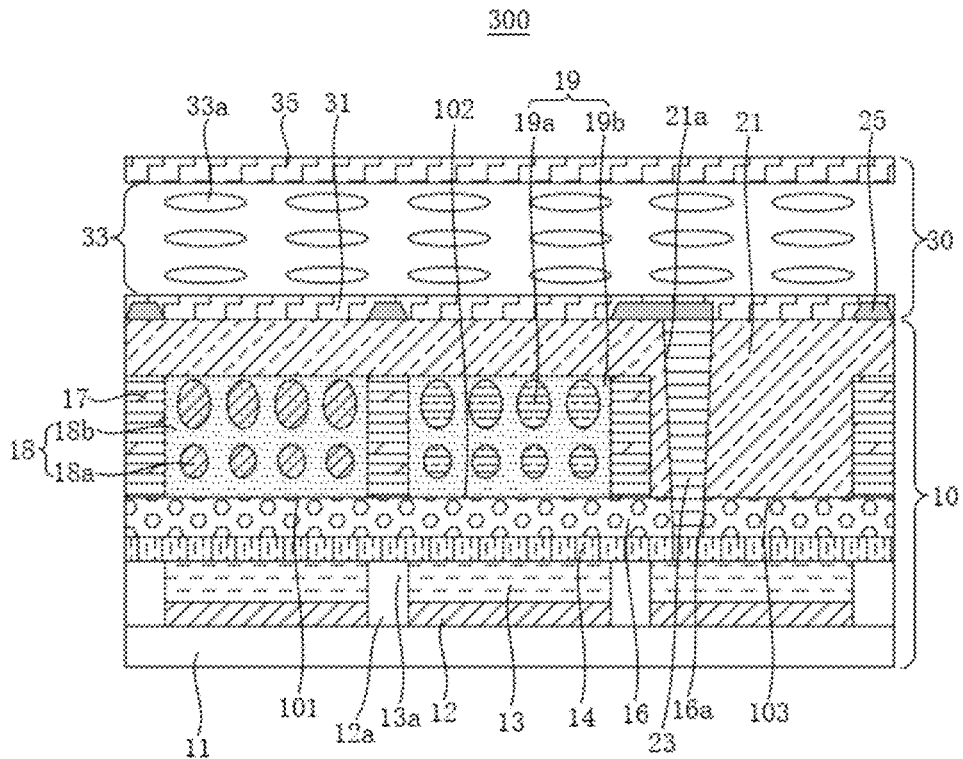
FIG. 4 shows a schematic diagram of a layer structure of the display panel in accordance with a third embodiment of the present disclosure.

Referring to FIG. 4, FIG. 4 shows a schematic diagram of a layer structure of the display panel in accordance with a third embodiment of the present disclosure. The display panel 200 discloses in a third embodiment differs from the display panel 200 disclosed in a second embodiment in that the light emitting component 10 further includes a conductive pattern layer 25.

In embodiments of the present disclosure, the light emitting component 10 further includes a conductive pattern layer 25. The conductive pattern layer 25 is located on one side of the second encapsulating layer 21 away from the first encapsulating layer 16. The first common electrode 31 covers the conductive pattern layer 25 on the second encapsulating layer 21 and is electrically connected to the conductive pattern layer 25, while the portion of the conductive pattern layer 25 corresponding to the third accommodation space 103 is electrically connected to the connecting member 23, so that the conductive pattern layer 25 is electrically connected to the connecting member 23, and in turn the first common electrode 31 is electrically connected to the connecting member 23 through the conductive pattern layer 25. That is, the connecting member 23 is located between the first common electrode 31 and the cathode layer 14, the conductive pattern layer 25 is embedded in the first common electrode 31 and electrically connected to the first common electrode 31; one surface of the conductive pattern layer 25 is exposed to a surface of the first common electrode 31 facing the cathode layer 14, and the opposite ends of the connecting member 23 are connected to the conductive pattern layer 25 and to the cathode layer 14 respectively to electrically connect the cathode layer 14 to the conductive pattern layer 25.

It can be understood that the electrical connection of the cathode layer 14, the conductive pattern layer 25 and the first common electrode 31 reduces the impedance of the cathode layer 14 and avoids an uneven display of the display panel 100 caused by a voltage drop (IR Drop) of the cathode layer 14, improving the product taste of the display panel 100.

It can be understood that the display panel 100 may be a large size display panel and that a thickness of the cathode layer 14 is thin, resulting in a higher impedance of the cathode layer 14, which is prone to voltage drops. The conductive pattern layer 25 and the first common electrode 31 reduces the impedance of the cathode layer 14 and avoids voltage degradation of the cathode layer 14.

In an exemplary embodiment, the materials of the conductive pattern layer 25 may be metal and the conductive pattern layer 25 may be formed by a yellow light process. It can be understood that the materials of the conductive pattern layer 25 may be a metal having a better electrical conductivity to further reduce the impedance of the cathode layer 14.

Figure 5:
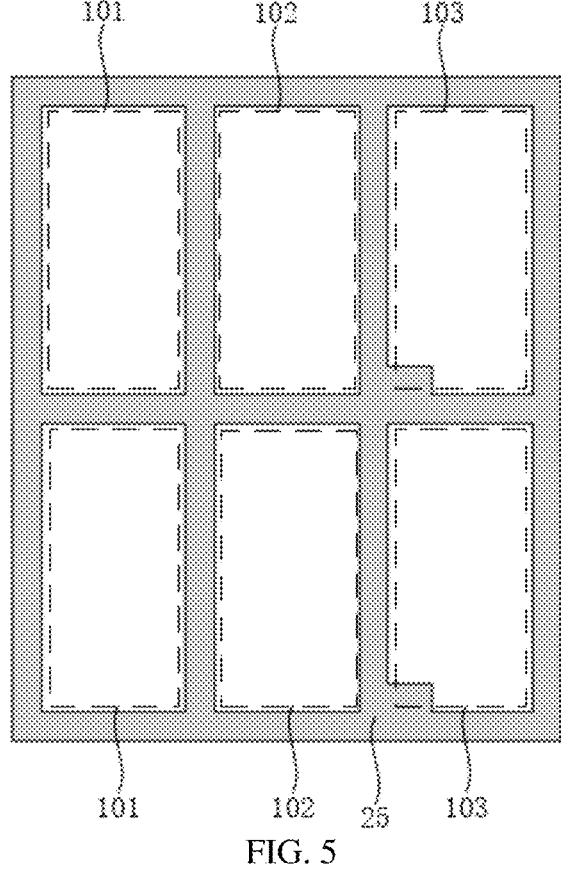
FIG. 5 is a schematic diagram of a planar structure of a conductive pattern layer of the display panel shown in FIG. 4.

In an exemplary embodiment, referring to FIGS. 4 and 5 together, FIG. 5 is a schematic diagram of a planar structure of a conductive pattern layer of the display panel shown in FIG. 4. A position of the conductive pattern layer 25 may correspond to a position of the light-shielding pattern layer 17, i.e. the orthographic projection of the conductive pattern layer 25 on the driver circuit layer 11 may coincide or partially coincide with the orthographic projection of the light-shielding pattern layer 17 on the driver circuit layer 11. A position of the conductive pattern layer 25 in connection with the connecting member 23 may not correspond to a position of the light-shielding pattern layer 17, i.e. the position of the conductive pattern layer 25 in connection with the connecting member 23 corresponds to the position of the third accommodation space 103. It can be understood that the small size of the portion of the conductive pattern layer 25 connected to the connecting member 23 does not affect the opening rate of the position corresponding to the third accommodation space 103.

It can be understood that the position of the conductive pattern layer 25 corresponds to the position of the light-shielding pattern layer 17, and the conductive pattern layer 25 can also avoid colour crosstalk in the corresponding positions of adjacent accommodation spaces, further improving the display effect of the display panel 300. At the same time, without affecting the transmittance of the display panel 300, the conductive pattern layer 25 can also block external light in a side view direction to achieve the anti-peep function, having the advantages of simple structure and low cost.

In summary, the display panel provided in embodiments of the present disclosure includes a light emitting component 10 and a light transmission control layer 30. The light transmission control layer 30 includes a first common electrode 31, a liquid crystal layer 33 and a second common electrode 35. The first common electrode 31, the liquid crystal layer 33 and the second common electrode 35 are stacked on a light emitting side of the light emitting component 10 in sequence. That is, the first common electrode 31 is located on a light emitting side of the light emitting component 10, the liquid crystal layer 33 is located on one side of the first common electrode 31 away from the light emitting component 10, and the second common electrode 35 is located on one side of the liquid crystal layer 33 away from the first common electrode 31. The liquid crystal layer 33 includes a plurality of liquid crystal molecules 33*a*. The first common electrode 31 and the second common electrode 35 are used for selectively forming a preset electric field. The preset electric field is used for driving the plurality of liquid crystal molecules 33*a* to deflect, so as to control a transmittance of the light transmission control layer 30. When the light emitting component 10 emits light, the light transmission control layer 30 transmits light; when the light emitting component 10 does not emit light, the light transmission control layer 30 does not transmit light, avoiding glare of the light emitting component 10 due to external light. Since external light cannot enter the light emitting component 10 through the light transmission control layer 30, even when the display panel 100 is viewed obliquely, there is still no glare.

Figure 6:
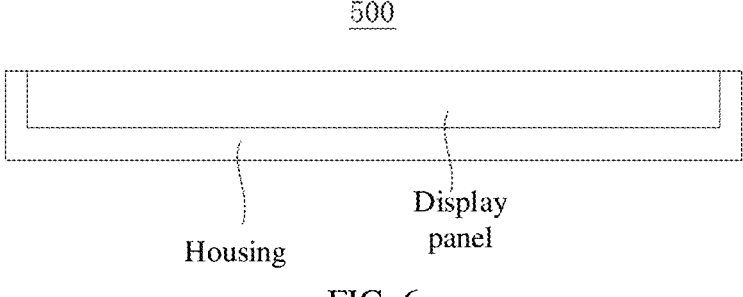
FIG. 6 shows a schematic diagram of a layer structure of the display device in accordance with a fourth embodiment of the present disclosure.

Based on the same inventive concept, certain embodiments of the present disclosure also provide a display device. Referring to FIG. 6, FIG. 6 shows a schematic diagram of a layer structure of the display device in accordance with a fourth embodiment of the present disclosure. The display device 500 provided by embodiments of the present disclosure may include at least a housing and a display panel as described above. The display panel is located within the housing. The light emitting side of the display panel is exposed from the housing. The housing is used to protect the display panel. The embodiment shown in FIGS. 1 to 5 describes the display panel in more detail and will not be repeated here.

In an exemplary embodiment, the display device 500 may be a Quantum Dot-Organic Light Emitting Diode (QD-OLED) display device.

It can be understood that the display device 500 may be used in electronic devices including, but not limited to, tablet computers, laptops, desktop computers, etc. According to the embodiments of the present disclosure, the specific type of the display device 500 is not particularly limited and can be designed accordingly by a person skilled in the art according to the specific usage requirements of the application of the display device 500, which will not be repeated here.

In an exemplary embodiment, the display device 500 may also include other necessary components and compositions such as a driver board, a power supply board, a high voltage board and a key control board, which may be added accordingly by a person skilled in the art according to the specific type and actual function of the display device 500, and which will not be repeated here.

In summary, the display device 500 provided in embodiments of the present disclosure includes a housing and a display panel. The display panel including a light emitting component 10 and a light transmission control layer 30. The light transmission control layer 30 includes a first common electrode 31, a liquid crystal layer 33 and a second common electrode 35. The first common electrode 31, the liquid crystal layer 33 and the second common electrode 35 are stacked on a light emitting side of the light emitting component 10 in sequence. That is, the first common electrode 31 is located on a light emitting side of the light emitting component 10, the liquid crystal layer 33 is located on one side of the first common electrode 31 away from the light emitting component 10, and the second common electrode 35 is located on one side of the liquid crystal layer 33 away from the first common electrode 31. The liquid crystal layer

33 includes a plurality of liquid crystal molecules 33*a*. The first common electrode 31 and the second common electrode 35 are used for selectively forming a preset electric field. The preset electric field is used for driving the plurality of liquid crystal molecules 33*a* to deflect, so as to control a transmittance of the light transmission control layer 30. When the light emitting component 10 emits light, the light transmission control layer 30 transmits light; when the light emitting component 10 does not emit light, the light transmission control layer 30 does not transmit light, avoiding glare of the light emitting component 10 due to external light. Since external light cannot enter the light emitting component 10 through the light transmission control layer 30, even when the display panel 100 is viewed obliquely, there is still no glare.

In the description of this specification, reference is made to the terms "an embodiment", "some embodiments", "schematic embodiment", "example", "specific example" or "some examples" means that the specific features, structures, materials or characteristics described in connection with the embodiment or example are included in at least one embodiment or example of the present disclosure. In this specification, the schematic expressions of the above terms do not necessarily refer to the same embodiment or example. Furthermore, the specific features, structures, materials or characteristics described may be combined in a suitable manner in any one or more of the embodiments or examples.

It should be understood that the application of the present disclosure is not limited to the examples given above, but may, to a person of ordinary skill in the art, be improved or transformed in accordance with the above description, and that all such improvements and transformations shall fall within the protection scope of the claims appended to the present disclosure. It will be understood by those of ordinary skill in the art to realize all or part of the process of the above embodiments, and equivalent variations made in accordance with the claims of this application, still fall within the scope covered by this application.

What is claimed is:

1. A display panel, comprising a light emitting component used for emitting light, wherein the display panel further comprises a light transmission control layer located on a light emitting side of the light emitting component; the light transmission control layer comprises a first common electrode, a liquid crystal layer and a second common electrode; the first common electrode, the liquid crystal layer and the second common electrode are stacked on the light emitting side of the light emitting component in sequence; the liquid crystal layer comprises a plurality of liquid crystal molecules; the first common electrode and the second common electrode are used for selectively forming a preset electric field according to a light emitting state of the light emitting component; the preset electric field is used for driving the plurality of liquid crystal molecules to deflect, so as to control a transmittance of the light transmission control layer;

the light emitting component comprises a driver circuit layer, a plurality of anode layers, a plurality of light emitting elements and a cathode layer; the driver circuit layer is located opposite to the light transmission control layer; the plurality of anode layers are spaced apart on one side of the drive circuit layer facing the light transmission control layer and are electrically connected to the drive circuit layer; the plurality of light emitting elements are spaced apart from each other, and located on one side of the anode layer away from the driver circuit layer and are electrically connected to the anode layer; the cathode layer is located on one side of the light emitting elements away from the anode layer and electrically connected to the plurality of light emitting elements; the driver circuit layer is used for driving the plurality of light emitting elements to emit basic light; and wherein the light emitting component further comprises a plurality of connecting members; the connecting members are connected between the first common electrode and the cathode layer; opposite ends of the connecting member are electrically connected to the cathode layer and the first common electrode, respectively.

2. The display panel according to claim 1, wherein the light emitting component further comprises a plurality of connecting members and a conductive pattern layer; the connecting members are located between the first common electrode and the cathode layer; the conductive pattern layer is embedded in the first common electrode and electrically connected to the first common electrode; one surface of the conductive pattern layer is exposed from a surface of the first common electrode facing the cathode layer; opposite ends of the connecting member are connected to the conductive pattern layer and the cathode layer respectively, to electrically connect the cathode layer to the conductive pattern layer.

3. The display panel according to claim 1, wherein the light emitting component further comprises a first encapsulating layer, the first encapsulating layer is located one one side of the cathode layer away from the light emitting elements.

4. The display panel according to claim 2, wherein the light emitting component further comprises a first encapsulating layer, the first encapsulating layer is located one one side of the cathode layer away from the light emitting elements.

5. The display panel according to claim 3, wherein the light emitting component further comprises a light-shielding pattern layer; the light-shielding pattern layer is located on one side of the first encapsulating layer away from the cathode layer; the light-shielding pattern layer defines a plurality of first accommodation spaces, a plurality of second accommodation spaces and a plurality of third accommodation spaces; a position of the first accommodation space, a position of the second accommodation space and a position of the third accommodation space respectively correspond to a position of the light emitting element;

the light emitting component further comprises a plurality of first color conversion members and a plurality of second color conversion members; the first color conversion member is located in the first accommodation space; the second color conversion member is located in the second accommodation space.

6. The display panel according to claim 5, wherein each first colour conversion member comprises a plurality of first quantum dots and a first package structure; the plurality of first quantum dots are distributed in multiple layers; the first package structure holds the plurality of first quantum dots in the first accommodation space; the first quantum dots are used to convert the base light into a first colour light;

each second color conversion member comprises a plurality of second quantum dots and a second package structure; the plurality of second quantum dots are distributed in multiple layers; the second package structure holds the plurality of second quantum dots in the second accommodation space; the second quantum dots are used to convert the base light into a second colour light.

7. The display panel according to claim 5, wherein the light emitting component further comprises a second encapsulating layer; the second encapsulating layer covers the light-shielding pattern layer, the plurality of first color conversion members and the plurality of second light emitting members, and extends into the third accommodation space.

8. The display panel according to claim 7, wherein the second encapsulating layer defines a plurality of first vias on one side away from the first encapsulating layer; the first encapsulating layer defines a plurality of second vias on one side away from the cathode layer; the first via cuts through the second encapsulating layer; the second via cuts through the first encapsulating layer; the first via is interconnected to the second via; part of the cathode layer is exposed from the first via; the first connecting member is located within the first via as well as within the second via to electrically connect the cathode layer to the first common electrode.

9. A display device, wherein the display device comprises a housing and a display panel, the display panel is located within the housing and the light emitting side of the display panel is exposed from the housing;

the display panel comprises a light emitting component used for emitting light, wherein the display panel further comprises a light transmission control layer located on a light emitting side of the light emitting component;

the light transmission control layer comprises a first common electrode, a liquid crystal layer and a second common electrode; the first common electrode, the liquid crystal layer and the second common electrode are stacked on the light emitting side of the light emitting component in sequence;

the liquid crystal layer comprises a plurality of liquid crystal molecules;

the first common electrode and the second common electrode are used for selectively forming a preset electric field according to a light emitting state of the light emitting component; the preset electric field is used for driving the plurality of liquid crystal molecules to deflect, so as to control a transmittance of the light transmission control layer;

wherein the light emitting component comprises a driver circuit layer, a plurality of anode layers, a plurality of light emitting elements and a cathode layer; the driver circuit layer is located opposite to the light transmission control layer; the plurality of anode layers are spaced apart on one side of the drive circuit layer facing the light transmission control layer and are electrically connected to the drive circuit layer; the plurality of light emitting elements are spaced apart from each other, and located on one side of the anode layer away from the driver circuit layer and are electrically connected to the anode layer; the cathode layer is located on one side of the light emitting elements away from the anode layer and electrically connected to the plurality of light emitting elements; the driver circuit layer is used for driving the plurality of light emitting elements to emit basic light; and wherein the light emitting component further comprises a plurality of connecting members; the connecting members are connected between the first common electrode and the cathode layer; opposite ends of the connecting member are electrically connected to the cathode layer and the first common electrode, respectively.

10. The display device according to claim 9, wherein the light emitting component further comprises a plurality of connecting members and a conductive pattern layer; the connecting members are located between the first common electrode and the cathode layer; the conductive pattern layer is embedded in the first common electrode and electrically connected to the first common electrode; one surface of the conductive pattern layer is exposed from a surface of the first common electrode facing the cathode layer; opposite ends of the connecting member are connected to the conductive pattern layer and the cathode layer respectively, to electrically connect the cathode layer to the conductive pattern layer.

11. The display device according to claim 9, wherein the light emitting component further comprises a first encapsulating layer, the first encapsulating layer is located one one side of the cathode layer away from the light emitting elements.

12. The display device according to claim 10, wherein the light emitting component further comprises a first encapsulating layer, the first encapsulating layer is located one one side of the cathode layer away from the light emitting elements.

13. The display device according to claim 11, wherein the light emitting component further comprises a light-shielding pattern layer; the light-shielding pattern layer is located on one side of the first encapsulating layer away from the cathode layer; the light-shielding pattern layer defines a plurality of first accommodation spaces, a plurality of second accommodation spaces and a plurality of third accommodation spaces; a position of the first accommodation space, a position of the second accommodation space and a position of the third accommodation space respectively correspond to a position of the light emitting element;

the light emitting component further comprises a plurality of first color conversion members and a plurality of second color conversion members; the first color conversion member is located in the first accommodation space; the second color conversion member is located in the second accommodation space.

14. The display device according to claim 13, wherein each first colour conversion member comprises a plurality of first quantum dots and a first package structure; the plurality of first quantum dots are distributed in multiple layers; the first package structure holds the plurality of first quantum dots in the first accommodation space; the first quantum dots are used to convert the base light into a first colour light;

each second color conversion member comprises a plurality of second quantum dots and a second package structure; the plurality of second quantum dots are distributed in multiple layers; the second package structure holds the plurality of second quantum dots in the second accommodation space; the second quantum dots are used to convert the base light into a second colour light.

15. The display device according to claim 13, wherein the light emitting component further comprises a second encapsulating layer; the second encapsulating layer covers the light-shielding pattern layer, the plurality of first color conversion members and the plurality of second light emitting members, and extends into the third accommodation space.

16. The display device according to claim 15, wherein the second encapsulating layer defines a plurality of first vias on one side away from the first encapsulating layer; the first encapsulating layer defines a plurality of second vias on one side away from the cathode layer; the first via cuts through the second encapsulating layer; the second via cuts through the first encapsulating layer; the first via is interconnected to the second via; part of the cathode layer is exposed from the first via; the first connecting member is located within the first via as well as within the second via to electrically connect the cathode layer to the first common electrode.

* * * * *